United States Patent [19]

Wallis et al.

[11] 4,162,461

[45] Jul. 24, 1979

[54] APPARATUS FOR EXTRACTING THE FUNDAMENTAL FREQUENCY FROM A COMPLEX AUDIO WAVE FORM

[75] Inventors: David W. Wallis, Atlanta; William H. Stewart, Mableton, both of Ga.

[73] Assignee: S.W.I.S., Inc., Atlanta, Ga.

[21] Appl. No.: 818,383

[22] Filed: Jul. 25, 1977

[51] Int. Cl.$^2$ .......................... H03H 7/10; H03H 7/14
[52] U.S. Cl. .................................. 333/174; 328/137; 328/167; 333/17 R
[58] Field of Search .................... 333/70 R, 76, 17 R, 333/79; 328/137, 167, 140; 307/261; 84/1.19, DIG. 9; 331/175, 182, 183

[56] References Cited

U.S. PATENT DOCUMENTS

| 3,644,847 | 2/1972 | Neuman | 328/137 |
| 3,805,091 | 4/1974 | Colin | 328/167 |
| 3,911,776 | 10/1975 | Beigel | 333/70 R X |
| 4,034,240 | 7/1977 | Foreman | 307/261 |

Primary Examiner—Alfred E. Smith
Assistant Examiner—Marvin Nussbaum
Attorney, Agent, or Firm—Walter M. Rodgers; Walter A. Rodgers

[57] ABSTRACT

Apparatus for extracting the fundamental frequency from a complex audio wave form and for producing a pulse representation of said fundamental frequency includes a low pass filter having a frequency response characteristic which tends to exclude harmonics together with a control circuit including amplifier means, peak detector means and voltage to current converter means for supplying a control signal to the low pass filter thereby to vary the cutoff frequency of the filter and to maintain substantially constant amplitude of the fundmental wave form together with voltage comparator means for comparing the peaks of an alternating current quantity dependent upon the output of said filter with a direct current quantity proportional to the output of the filter, said comparator means thereby producing a pulse per cycle of said fundamental frequency.

4 Claims, 8 Drawing Figures

APPARATUS FOR EXTRACTING THE FUNDAMENTAL FREQUENCY FROM A COMPLEX AUDIO WAVE FORM

Generally speaking, musical wave forms are complex combinations of a fundamental frequency and harmonics. The harmonics present in the wave form vary depending upon the specific musical instrument used, the note played and the loudness level at which the instrument is played. Cases have been observed in which the second harmonic is more than twenty decibels higher in amplitude than the fundamental.

It would be desirable to be able to control musical synthesizer functions especially oscillator tuning and the like with some other instrument such as a guitar. To achieve this control, it would be desirable to derive some representation of the fundamental frequency of the audio signal source. Once such a representation is derived, it can be processed through auxiliary circuitry to control many synthesizer functions, including the oscillator frequency. In such situations, it is necessary to reduce the second and other harmonics and such result is achieved by use of a low pass filter.

While a fixed low pass filter effectively reduces harmonics, the amplitude of the output wave is substantially reduced. It is therefore desirable to modify the cutoff frequency of a low pass filter in accordance with a quantity derived from the filter output and thus to maintain substantially constant amplitude of the fundamental frequency wave form. Such a wave form may then be compared with a direct current quantity proportional to the output of the filter and the resultant wave applied to some specific use.

According to this invention in one form, a low pass filter circuit is arranged to exclude harmonics and a control signal derived from the output of the filter is applied to the filter so as to vary the cutoff frequency thereof and thereby to maintain substantially constant amplitude of the fundamental wave form which then may be supplied to suitable voltage comparator means which compares the peaks thereof with a direct current quantity proportional to the output of the filter thereby to produce a pulse for every cycle of the fundamental frequency of the complex musical wave form supplied to the apparatus.

For a better understanding of the invention reference may be had to the following detailed description taken in conjunction with the accompanying drawings in which FIG. 1 represents a complex audio wave form which contains a number of harmonics;

Figure 3:
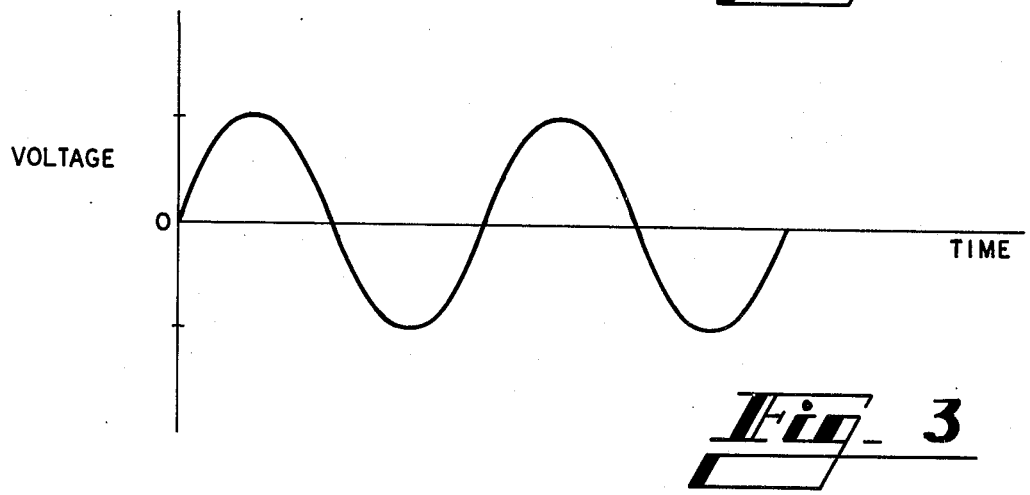
FIG. 3 represents a wave which is supplied by a filter constructed according to this invention and which substantially eliminates the second harmonic of FIG. 2 while maintaining substantially constant amplitude of the fundamental irrespective of variations in input frequencies and amplitudes.
Figure 4:
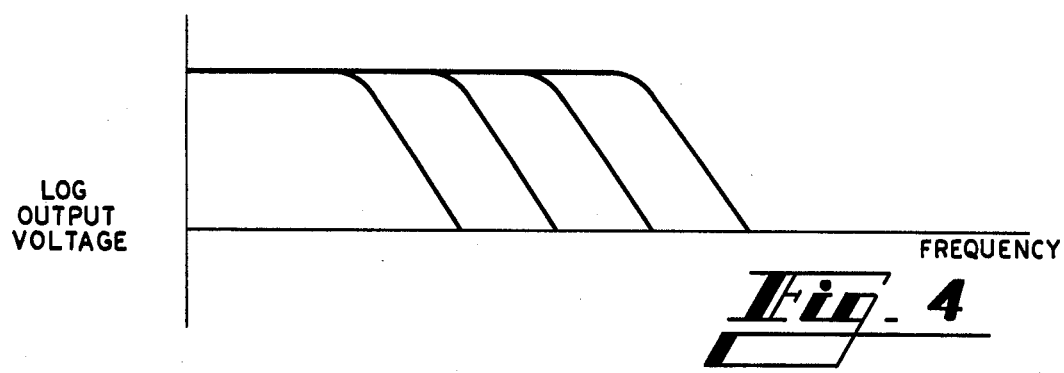
Figure 5:
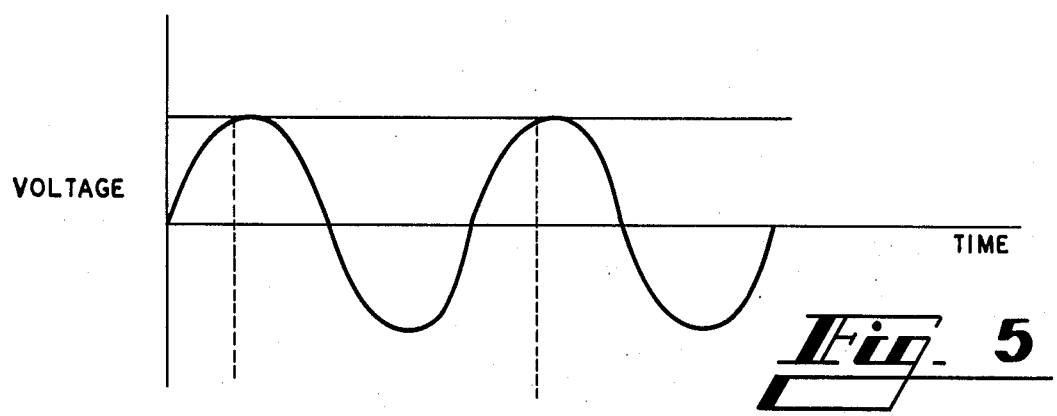
Figure 6:
Figure 7:
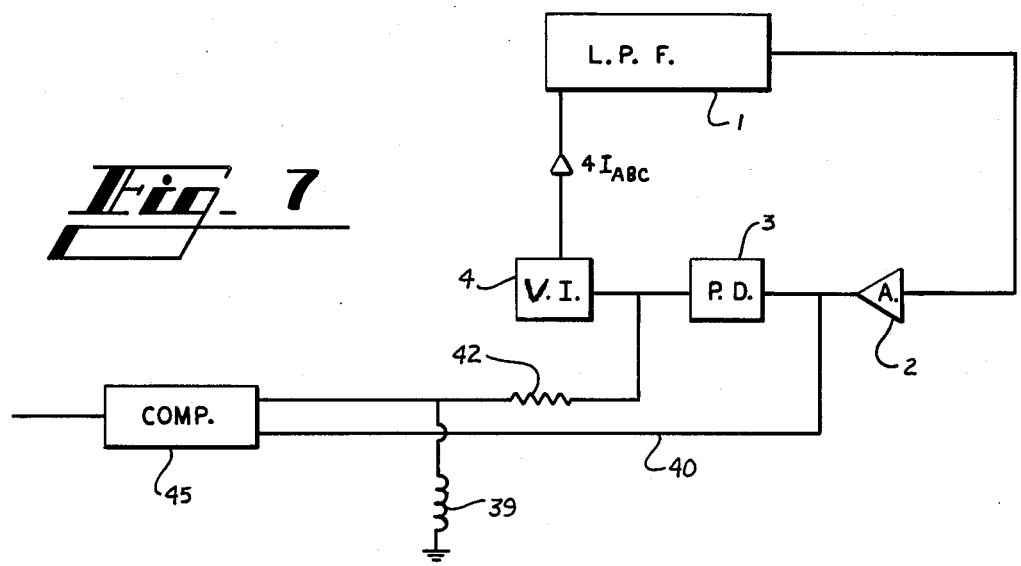
Figure 8:
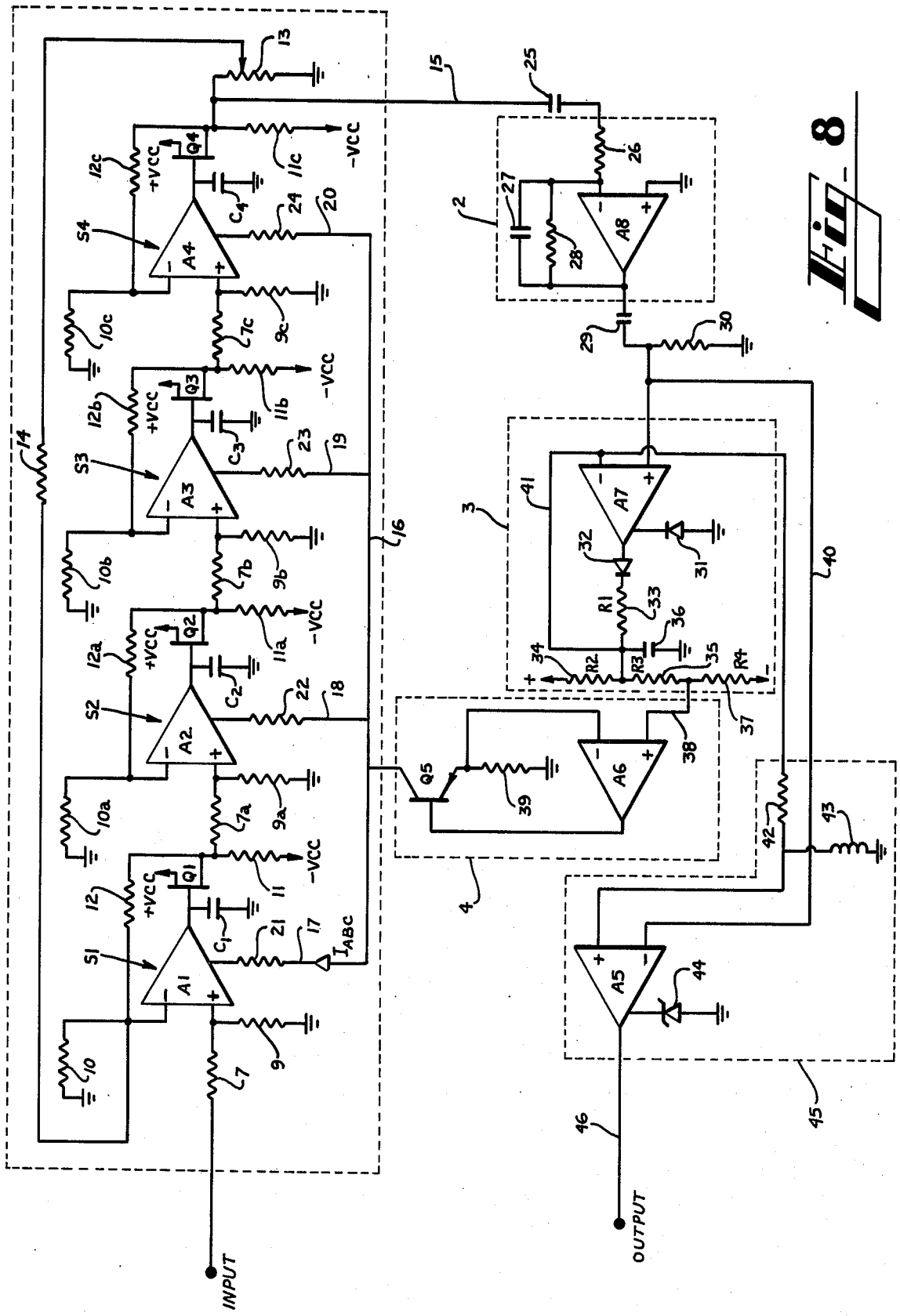

FIG. 4 includes a family of frequency response curves of a filter wherein frequency is plotted on the abscissa and log of voltage output is plotted on the ordinate;

FIG. 5 includes a curve similar to FIG. 3 but which shows the addition of a direct current quantity whose magnitude is proportional to the peak magnitude of the fundamental;

FIG. 6 represents a pulse wave form output of the invention derived from the wave forms of FIG. 5;

FIG. 7 is a block diagram of a system constructed according to this invention and in which FIG. 8 is a schematic circuit corresponding to the block diagram of FIG. 7.

Figure 1:
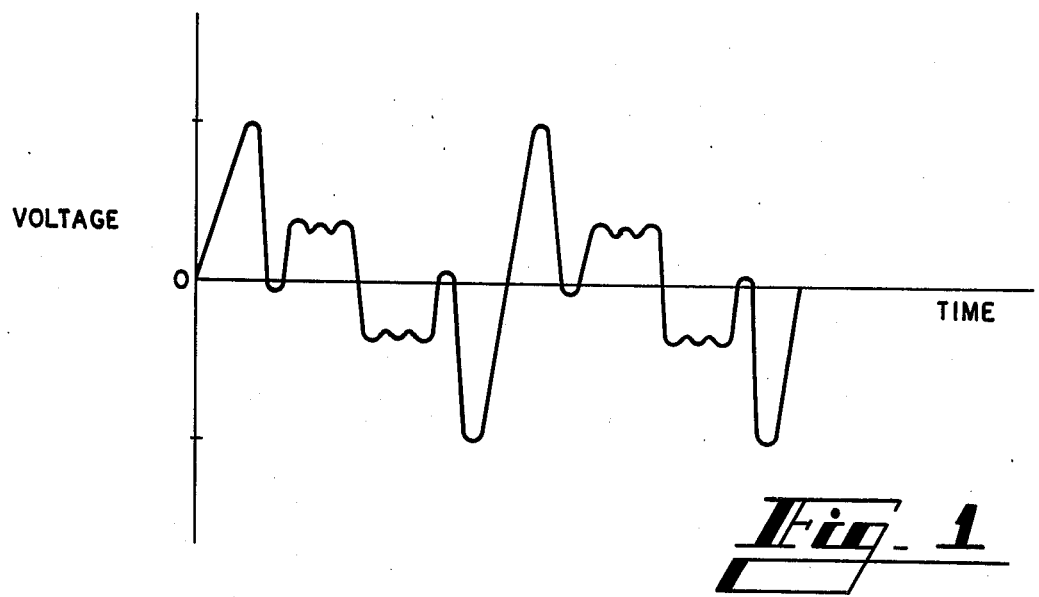

An audio sound such as might be produced by instrumental means frequently is characterized by a highly complex wave form which includes fundamental and a multiplicity of harmonic frequencies particularly the second harmonic. FIG. 1 represents a voltage wave derived from a complex audio wave form. The wave form shown in FIG. 1 is not directly usable as a reference wave which can be applied as might be desired through suitable mixing circuits, synthesizers and the like to produce desirable sound effects. Such is also true of the wave of FIG. 2 which includes significant second harmonics. It is therefore desirable to produce a substantially sinusoidal wave form such as might be represented at FIG. 3 from a complex wave form such as those represented by FIGS. 1 and 2.

Figure 2:
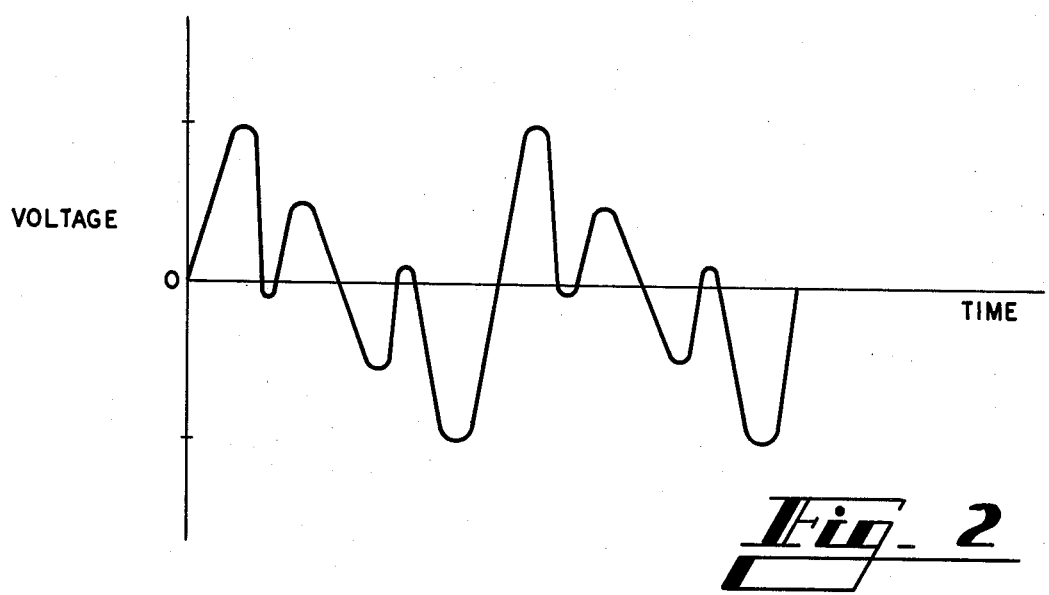
FIG. 2 represents a wave form having a fundamental frequency and a very high second harmonic.

A complex wave form such as is shown in FIGS. 1 and 2 can be filtered through a fixed low pass filter in known manner and harmonics substantially eliminated. This effect is undesirable to the extent that the amplitude of the fundamental output wave is at low levels which may prove to be practically unusable for subsequent processing. In order to maintain a substantially constant usable amplitude characteristic of the fundamental wave derived from a low pass filter, it is desirable to modify the cutoff frequency by a signal derived from the output of the filter and thus to produce filter characteristics as represented in FIG. 4.

As is apparent in FIG. 7, the output of the low pass filter 1 is supplied to amplifier 2 which in turn supplies a usable signal to the peak detector 3 the output of which is supplied through a voltage to current converter 4 which in turn applies a control signal to the low pass filter 1. By this general means, the cutoff frequency of the low pass filter 1 is varied as is generally represented by the curves of FIG. 4. The components designated by the numerals 1–4 inclusive in FIG. 7 are represented in FIG. 8 by dotted line enclosures designated by the corresponding numerals 1–4, inclusive.

With reference to FIG. 8 the low pass filter 1 comprises four stages designated S1–S4 and stage S1 is supplied with a signal such as might be supplied by a preamplifier through input terminal 5 and then through resistor 7 to operational transconductance amplifier A1. A second resistor 9 is connected between ground and the non-inverting input terminal of A1. The inverting terminal of A1 is grounded through resistor 10. The output of operational transconductance amplifier A1 is supplied to capacitor C1. The capacitor C1 is connected to the gate of field-effect transistor (FET) source follower Q1 the drain of which is connected to positive voltage Vcc and the source of which is connected through load resistor 11 to negative voltage Vcc. Local negative feed back is supplied through resistor 12.

Stages S1–S4 are identical in structure and function. The output of stage 1 is supplied through resistor 7a to the non-inverting input terminal of operational transconductance amplifier A2 which functions in the same manner as stage S1 and the designation of the S2 components are by corresponding numerals with the suffix "a" added. Similarly the components of S3 utilize the same numerals with the suffix "b" added while stage S4 utilizes the same numerals with the suffix "c" added.

Feedback is supplied through resistors 13 and 14 to the inverting terminal of operational transconductance amplifier A1.

The low pass filter 1 as shown schematically in FIG. 8 thus comprises a four stage device including four variable transconductancies in the form of amplifiers A1–A4 inclusive together with the capacitors C1–C4 inclusive which determine the time constant of the filter. While four stages are represented in FIG. 8, it will be understood that the invention is not limited to four stages and that different numbers of stages may be employed if desired.

The cutoff frequency of filter 1 is controlled by a signal supplied through conductor 15 to amplifier 2 and thence through peak detector 3 and voltage to current converter 4 and conductors 16–20 and resistors 21–24 to the amplifiers A1–A4 inclusive. This signal causes variations in the characteristic cutoff frequency as represented by FIG. 4 for four different individual inputs by controlling the gain of transconductancies A1–A4.

The alternating current signal supplied through conductor 15 to amplifier 2 is fed through coupling capacitor 25 and coupling resistor 26 to an input terminal of amplifier A8. The other input terminal of amplifier A8 is connected to ground and the output terminal of amplifier A8 is connected through a feed back circuit including parallel capacitor 27 and resistor 28 to its input terminal.

The output of amplifier A8 in the form of an amplified and usable signal is supplied through coupling capacitor 29 to an input terminal of amplifier A7 of peak detector 3. Resistor 30 is interconnected between ground and the output terminal of coupling capacitor 29.

Peak detector 3 is provided with a diode 31 interconnected between ground and the output of amplifier A7. The output of amplifier A7 is also supplied through diode 32 and resistor 33 to the junction between resistors 34 and 35 and to one terminal of grounded capacitor 36. Positive voltage is applied to one terminal of resistor 34 and negative voltage is applied to one terminal of resistor 37, the other terminal of which is interconnected with resistor 35.

Peak detector 3 supplies a half wave rectified signal to the junction between resistors 34 and 35 which in conjunction with resistor 37 effects a shift in the level of the rectified signal to cause the voltage level at the junction between resistors 35 and 37 to follow the voltage at the junction between resistors 35 and 34 and thereby to produce the proper voltage to be applied to the voltage to current converter 4.

The output conductor 38 from the peak detector 3 is connected to the noninverting input terminal of amplifier A6, the output of which is supplied to the base of transistor Q5. The emitter of transistor Q5 is connected to the inverting input terminal of amplifier A6 and is also connected to ground through resistor 39. $I_{ABC}$ designates the amplifier bias current of each operational conductance amplifier. The collector of transistor Q5 is interconnected with conductor 16 and thus the output of voltage to current converter 4, in the form of a current $4I_{ABC}$ constitutes a variable control signal supplied to operational transconductance amplifiers A1–A4 inclusive. It is by this arrangement that the cutoff frequency as represented in FIG. 4 of the filter 1 is varied in accordance with the output of that filter. The result of the circuitry described thus far is therefore a substantially sinusoidal wave form as shown in FIGS. 3 and 5 at conductor 40.

In order to provide one pulse per cycle of the fundamental frequency of the input signal, a voltage comparator circuit 45 is employed. An alternating current signal is supplied through conductor 40 from the junction between capacitor 29 and resistor 30 to the inverting input terminal of voltage comparator A5. A direct current signal is supplied through conductor 41 from the junction between resistors 33, 34 and 35 and capacitor 36 through resistor 42 to the other input terminal of amplifier A5. A diode 44 is interconnected between ground and the output terminal of voltage comparator A5. Conductor 41 is grounded through resistor 43 so as to attenuate the direct current signal supplied to voltage comparator A5 through conductor 41 so that its magnitude is somewhat below the peak amplitude of the sinusoidal wave shown in FIG. 5. Thus the relationships between the quantities are such that the wave as shown in FIG. 6 represents the output through conductor 46 the frequency of which corresponds to the frequency of the fundamental wave which constitutes a part of the complex wave form supplied to the input terminal 5.

Thus the voltage comparator compares the attenuated peak direct current voltage from the output of the peak detector with the alternating current voltage output of the amplifier 2. When the alternating current amplitude exceeds the direct current magnitude the comparator produces a pulse for use as desired such as to produce a direct current voltage that varies with the input frequency.

The embodiments of the invention in which an exclusive property or privilege is claimed are defined as follows:

1. Apparatus for extracting the fundamental frequency from a complex wave form having harmonics, said apparatus comprising a low pass filter having a plurality of sections each section including capacitance means of fixed capacitance and a variable transconductance, amplifier means to which the output of said filter is supplied, peak detector means to which the output of said amplifier means is supplied, a voltage to current converter to which the output of said peak detector means is supplied, circuit means for supplying the output signal from said voltage to current converter to each of said variable transconductances thereby to vary the frequency response characteristic of said low pass filter, and comparator means for receiving an alternating current signal dependent upon the output of said filter and for receiving a direct current signal dependent upon the output of said peak detector means and for comparing said signals and for supplying the resultant signal to an output circuit.

2. Apparatus for extracting the fundamental frequency from a complex wave form having harmonics and for producing a single pulse for each peak of the fundamental, said apparatus comprising a low pass filter including capacitance means of substantially fixed capacitance and variable transconductance means, peak detector means for deriving signals from peaks of the alternating current output of said low pass filter, voltage to current converter means for applying a control bias to said transconductance means dependent upon the output of said peak detector means thereby to control the frequency response characteristic of said low pass filter, and comparator means for receiving an alternating current signal dependent upon the output of said filter and for receiving a direct current signal dependent upon the output of said peak detector means and for comparing said signals and for supplying the resultant signal to an output circuit.

3. Apparatus for deriving one pulse per each fundamental peak of a complex wave form having a plurality of harmonics, said apparatus comprising a low pass filter having a frequency response characteristic such that its output tends to exclude harmonics, circuit means for deriving a control signal from the output of said filter and for applying said control signal to said filter so as to vary said cutoff frequency of said filter and thereby to maintain substantially constant amplitude of said fundamental frequency wave, and comparator means for comparing the peaks of an alternating current quantity dependent upon the output of said filter with a direct current quantity proportional to the output of said filter.

4. Apparatus according to claim 3 wherein voltage attenuation means effects a reduction of said direct current quantity relative to said peaks.

* * * * *